(12) United States Patent
Otani

(10) Patent No.: US 10,425,052 B2
(45) Date of Patent: Sep. 24, 2019

(54) DIFFERENTIAL INPUT STAGES

(71) Applicant: TEXAS INSTRUMENTS INCORPORATED, Dallas, TX (US)

(72) Inventor: Daijiro Otani, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/805,696

(22) Filed: Nov. 7, 2017

(65) Prior Publication Data

US 2019/0140607 A1 May 9, 2019

(51) Int. Cl.
*H03F 3/45* (2006.01)
*H03F 1/22* (2006.01)

(52) U.S. Cl.
CPC ......... *H03F 3/45273* (2013.01); *H03F 1/223* (2013.01); *H03F 3/45183* (2013.01); *H03F 3/45179* (2013.01); *H03F 2203/45021* (2013.01); *H03F 2203/45026* (2013.01)

(58) Field of Classification Search
CPC .. H03F 3/45273; H03F 1/223; H03F 3/45183; H03F 2203/45021; H03F 2203/45026; H03F 3/45; H03F 3/45179; H03F 3/45188; H03F 3/45192; H03F 2200/177; H03F 3/45174; H03F 3/45372; H03F 3/4547; H03F 2203/45054; H03F 2203/45096; H03F 2203/45124; H03F 3/45071; H03F 3/45085
USPC .................................................. 330/253, 257
See application file for complete search history.

(56) References Cited

U.S. PATENT DOCUMENTS

| | | | | |
|---|---|---|---|---|
| 7,176,760 | B2 * | 2/2007 | Jones | H03F 3/45192 330/253 |
| 7,768,351 | B2 * | 8/2010 | Ivanov | H03F 3/45179 330/255 |
| 8,493,148 | B2 * | 7/2013 | Murden | H03F 3/45179 330/253 |
| 8,928,409 | B1 | 1/2015 | Opris | |
| 2004/0080369 | A1 | 4/2004 | Pradhan | |
| 2006/0044167 | A1 * | 3/2006 | Bhattacharjee | G06G 7/30 341/143 |
| 2009/0066415 | A1 * | 3/2009 | Kim | H03F 1/0205 330/253 |
| 2009/0108882 | A1 * | 4/2009 | Fattaruso | H03F 3/3071 327/67 |

(Continued)

FOREIGN PATENT DOCUMENTS

JP 2010-041131 A 2/2010

OTHER PUBLICATIONS

PCT Search Report dated Feb. 28, 2019.

*Primary Examiner* — Khanh V Nguyen
(74) *Attorney, Agent, or Firm* — Lawrence J. Bassuk; Charles A. Brill; Frank D. Cimino

(57) ABSTRACT

In some embodiments, a differential input stage comprises a first n-type metal oxide semiconductor transistor (NMOS) pair coupled to a first input and a second input, a second NMOS pair coupled to the first input, a first output node, the second input, and a second output node, a first diode coupled to the first NMOS pair and the first output node, a second diode coupled to the first NMOS pair and the second output node, and a cascaded current source coupled to the first NMOS pair and the second NMOS pair.

20 Claims, 2 Drawing Sheets

(56) References Cited

U.S. PATENT DOCUMENTS

2009/0322429 A1* 12/2009 Ivanov ................ H03F 3/45179
330/257
2014/0180052 A1* 6/2014 Lo ........................ A61B 5/0476
600/377

* cited by examiner

DIFFERENTIAL INPUT STAGES

BACKGROUND

Amplifiers are electrical circuits that receive an input signal and generate an output signal at least partially according to the input signal. Amplifiers may increase, decrease, or leave substantially unchanged a value of the output signal with respect to the input signal. To process the input signal when it is received by an amplifier, the amplifier may include an input stage.

SUMMARY

In some embodiments, a differential input stage comprises a first n-type metal oxide semiconductor transistor (NMOS) pair coupled to a first input and a second input, a second NMOS pair coupled to the first input, a first output node, the second input, and a second output node, a first diode coupled to the first NMOS pair and the first output node, a second diode coupled to the first NMOS pair and the second output node, and a cascaded current source coupled to the first NMOS pair and the second NMOS pair.

In some embodiments, an amplifier comprises a differential input stage and an output stage. In some embodiments, the differential input stage comprises a first NMOS pair coupled to a first input and a second input, a second NMOS pair coupled to the first input, the second input, a first output node, and a second output node, a first diode coupled between the first NMOS pair and the first output node, a second diode coupled between the first NMOS pair and the second output node, and a cascaded current source coupled between the first NMOS pair, the second NMOS pair, and a ground voltage potential. In some embodiments, the output stage is coupled to the first output node and the second output node. In some embodiments, the output stage comprises at least one transistor configured to amplify an output of the differential input stage present at the first and second output nodes to produce an amplifier output.

In some embodiments, a differential input stage comprises a first diode having a first anode coupled to a first output node and a second diode having a second anode coupled to a second output node. In some embodiments, the differential input stage further comprises a first NMOS differential amplifier comprising a first NMOS transistor comprising a first gate terminal coupled to a first input, a first drain terminal coupled to a cathode of the first diode, and a first source terminal coupled to a first node. In some embodiments, the first NMOS differential amplifier further comprises a second NMOS transistor comprising a second gate terminal coupled to a second input, a second drain terminal coupled to a cathode of the second diode, and a second source terminal coupled to the first node. In some embodiments, the differential input stage further comprises a second NMOS differential amplifier comprising a third NMOS transistor comprising a third gate terminal coupled to the first input, a third drain terminal coupled to the first output node, and a third source terminal coupled to a second node. In some embodiments, the second NMOS differential amplifier further comprises a fourth NMOS transistor comprising a fourth gate terminal coupled to the second input, a fourth drain terminal coupled to the second output node, and a fourth source terminal coupled to the second node. In some embodiments, the differential input stage further comprises a cascaded current source coupled between the first node, the second node, and a ground voltage potential.

BRIEF DESCRIPTION OF THE DRAWINGS

For a detailed description of various examples, reference will now be made to the accompanying drawings in which.

DETAILED DESCRIPTION

Figure 1:
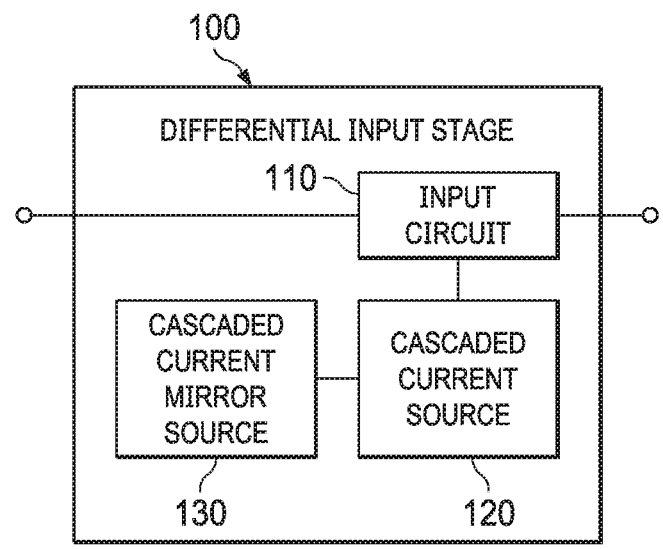
FIG. 1 shows a block diagram of an illustrative differential input stage in accordance with various embodiments.

To provide a wide input range—for example, a wide common mode voltage input range—input stages of amplifiers and other electronic circuits often include both n-type metal oxide semiconductor (NMOS) transistors and p-type metal oxide semiconductor (PMOS) transistors. The common mode input voltage is, for example, an absolute voltage with respect to a ground voltage potential (which may be contrasted with a differential voltage that has a value with respect to another voltage level). The inclusion of the NMOS transistors and the PMOS transistors allows the wide input range because the NMOS operates at high input voltages and the PMOS operates at low input voltages. The inclusion of NMOS and PMOS transistors in such input stages, however, may result in high power consumption, high circuit complexity, and large surface areas. For example, the NMOS transistors and the PMOS transistors may require separate tail currents, outputs of the NMOS transistors and the PMOS transistors may require additional circuitry or circuit complexity to be combined at some location in a circuit that includes or is coupled to the input stage, and the PMOS transistors may be large in size in comparsion to the NMOS transistors.

Disclosed herein are embodiments that provide for a differential input stage that at least partially mitigates the disadvantages described above. In some embodiments, the differential input stage comprises a pair of standard NMOS transistors and a pair of natural (also known as "native") NMOS transistors. Such differential input stages improve over existing differential input stages by including the pair of standard NMOS transistors and the pair of natural NMOS transistors in lieu of a combination of NMOS transistors and PMOS transistors. The improvement may include, for example, reduced size or footprint, less complex circuit design (e.g., fewer supporting components), reduced power consumption, and/or reduced cost of manufacturing. Although described herein as including a pair of standard NMOS transistors and a pair of natural NMOS transistors, the differential input stage may include any one or more types of NMOS transistors that provide for the functionality described herein. Various differential input stage embodiments and their operation are now described.

The standard NMOS transistor pair and the natural NMOS transistor pair together facilitate operation of the differential input stage for an input signal having a value of approximately zero volts to an input signal having a value, of approximately a source supply voltage of the differential input stage. (The term "approximately," as used herein, means plus or minus 10% of the stated value.) When the input signal has a low voltage level, such as approximately zero volts, only one of the standard NMOS transistor pair or the natural NMOS transistor may operate in the differential input stage to conduct a majority (or approximately all) current passing through the differential input stage, When the input signal has a high voltage level, such as approximately the source supply voltage, an opposite of the standard NMOS transistor pair or the natural NMOS transistor pair than was active when the input signal had a low voltage level may dominate, operating to conduct a majority of current passing through the differential input stage. When the input signal has neither a low nor a high voltage level, both the standard NMOS transistor pair and the natural NMOS transistor pair may operate to conduct the current passing through the differential input stage with a first of the transistor pairs conducting a first portion of the current and a second of the transistor pairs conducting a second portion of the current. The first and second portions of the current may be approximately equal or may be different such that one of the portions may be significantly larger than the other portion.

Referring now to FIG. 1, a block diagram of an illustrative differential input stage 100 in accordance with various embodiments is shown. The differential input stage 100 may be implemented as a differential input stage of an amplifier such as, and without limitation, an operational amplifier and/or an operational transconductance amplifier. In some embodiments, a plurality of differential input stages 100 are implemented such that multiple amplifications are provided, where each differential input stage 100 may have a same gain or may have a different gain than other differential input stages 100. In other embodiments, the differential input stage may be implemented in devices other than amplifiers, such as, and without limitation, any electrical device that receives a differential input signal.

In some embodiments, the differential input stage 100 comprises an input circuit 110, a cascaded current source 120 and a cascaded current mirror source 130. In some embodiments, the input circuit 110 comprises a plurality of NMOS transistor pairs (not shown) arranged in a differential configuration. While illustrated as receiving one input, in practice the input circuit 110 may receive any number of inputs, the scope of which is not limited herein. Each of the plurality of NMOS transistor pairs may receive a pair of inputs of the differential input stage 100. The inputs may be rail-to-rail inputs that may have a value ranging between approximately zero volts and approximately a source supply voltage of the differential input stage 100. For example, a first NMOS transistor of a NMOS transistor pair may receive a first input and a second NMOS transistor of the NMOS transistor pair may receive a second input. In some embodiments, a number of NMOS transistor pairs in the input circuit 100 may be at least partially determined based on a number of signals desired for the differential input stage 100 to receive and/or process.

In some embodiments, the cascaded current source 120 couples to the input circuit 110 and provides a tail current for at least some of the NMOS transistor pairs of the input circuit 110. For example, the cascaded current source 120 may provide a path to ground for current to flow from a source supply (not shown) through one or more NMOS transistor pairs of the input circuit 100 and the cascaded current source 120. The cascaded current source 120 may be at least partially controlled by the cascaded current mirror source 130. In some embodiments, the cascaded current mirror source 130 generates one or more reference signals that may bias one or more components of the cascaded current source 120. The biasing may at least partially control an amount of current flowing through components of the cascaded current source 120.

Figure 2:
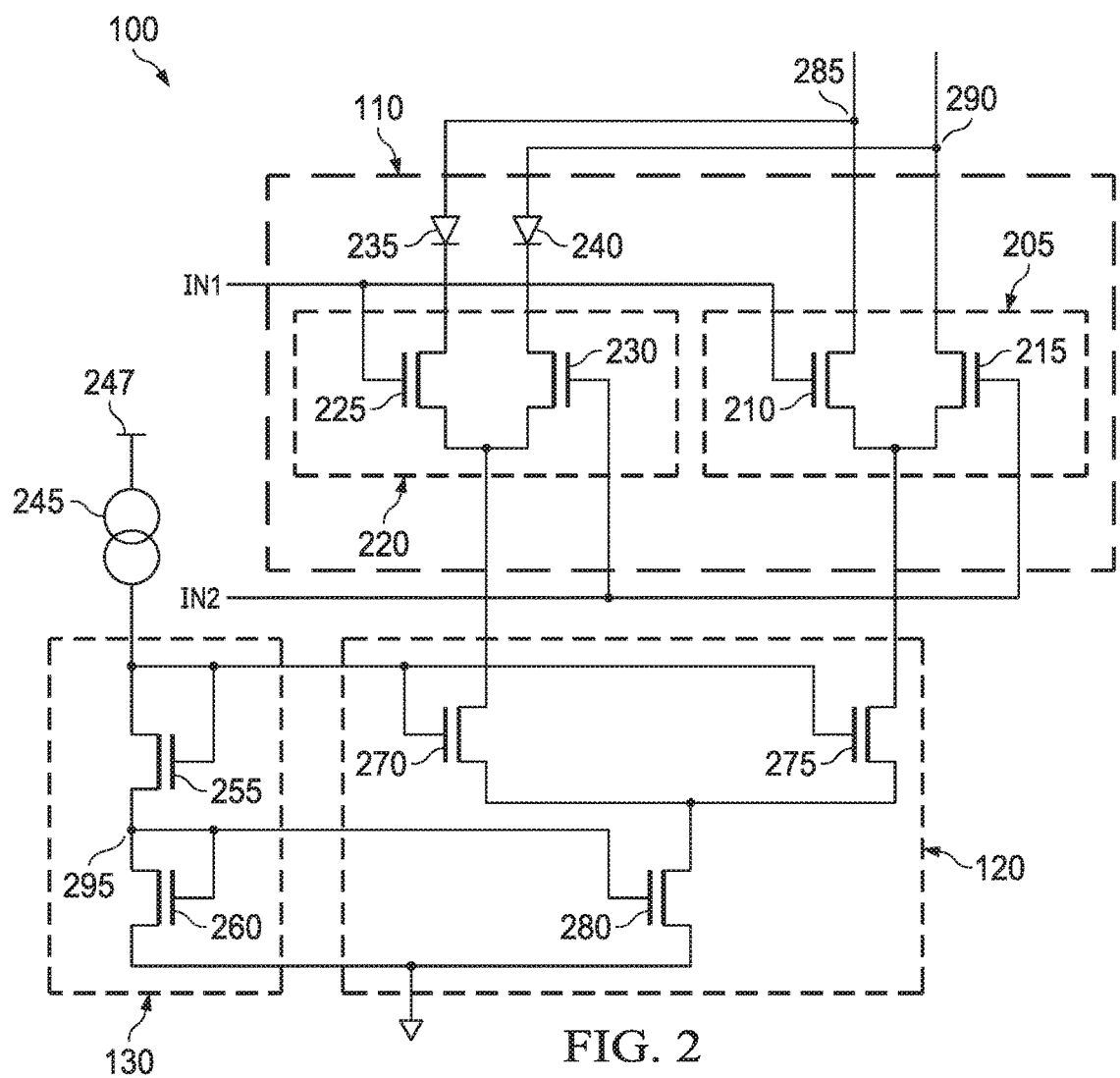
FIG. 2 shows a schematic diagram of the illustrative differential input stage in accordance with various embodiments.

Referring now to FIG. 2, a schematic diagram of the illustrative differential input stage 100 in accordance with various embodiments is shown. In some embodiments, the differential input stage 100 comprises a standard NMOS differential pair 205 (including standard NMOS 210 and standard NMOS 215), a natural NMOS differential pair 220 (including natural NMOS 225 and natural NMOS 230), diodes 235 and 240, constant current source 245 coupled to a voltage supply 247, a cascaded current mirror source 130 (including NMOS 255 and NMOS 260), and cascaded current source 120 (including NMOS 270, NMOS 275, and NMOS 280). In some embodiments, the standard NMOS differential pair 205 and the natural NMOS differential pair 220 are each configured as a differential amplifier. In some embodiments, the NMOS 210 and NMOS 215 of the standard NMOS differential pair 205 may be referred to as enhancement mode NMOS. In some embodiments, the NMOS 210, NMOS 215. NMOS 225, NMOS 230 diode 235, and diode 240 may together comprise the input circuit 110 of FIG. 1.

In some embodiments, the NMOS 210 includes a drain terminal coupled to a node 285, a gate terminal configured to receive a first input signal IN1 (e.g., a first portion of a differential input signal), and the NMOS 210 further includes a source terminal coupled to a source terminal of the NMOS 215 and to a drain terminal of the NMOS 275 of the cascaded current source 120. In some embodiments, the NMOS 215 includes a drain terminal coupled to a node 290, a gate terminal configured to receive a second input signal IN2 (e.g., a second portion of the differential input signal), and a source terminal coupled to the source terminal of the NMOS 210 and the drain terminal of the NMOS 275 of the cascaded current source 120. In some embodiments, the NMOS 210 and the NMOS 215 may conduct current from theft respective drain terminals to their respective source terminals when they receive voltages at their respective gate terminals that cause their gate to source voltages to exceed their respective activation thresholds. Such activation thresholds may be, for example, minimum differences in voltages present at the respective gate terminals and the respective source terminals that when exceeded cause channels to form between the drain and source terminals and current to be conducted between the drain and source terminals. In some embodiments (e.g., such as for the NMOS 210 and the NMOS 215), the activation threshold is 1 volt (V).

In some embodiments, the NMOS 225 includes a drain terminal coupled to a cathode of the diode 235, a gate terminal configured to receive the first input signal IN1, and a source terminal coupled to a source terminal of the NMOS 230 and a drain terminal of the NMOS 270 of the cascaded current source 120. In some embodiments, the NMOS 230 includes a drain terminal coupled to a cathode of the diode 240, a gate terminal configured to receive the second input signal IN2, and a source terminal coupled to the source terminal of the NMOS 225 and to the drain terminal of the NMOS 270 of the cascaded current source 120. In some embodiments, an anode of the diode 235 is coupled to the node 285 and an anode of the diode 240 is coupled to the node 290. In some embodiments, an output of the differential input stage 100 is taken across nodes 285 and 290 (e.g., such that a first output of the differential input stage 100 is taken at node 285 and a second output of the differential input stage 100 is taken at node 290). In some embodiments, the NMOS 225 and the NMOS 230 may conduct current from theft respective drain terminals to their respective source terminals when they receive voltages at their respective gate terminals that cause their gate to source voltages to exceed their respective activation thresholds. The activation thresholds may be, for example, differences in voltages present at the respective gate terminals and the respective source terminals. In some embodiments (e.g., such as for the NMOS 225 and the NMOS 230), the activation thresholds may be 0 V. In some embodiments, the NMOS 225 and NMOS 230 of the natural NMOS differential pair 220 may be implemented as depletion mode NMOS transistors. In such embodiments, the activation threshold may be negative.

In some embodiments, the cascaded current source 120 is coupled between the standard NMOS differential pair 205, the natural NMOS differential pair 220, and a ground voltage potential such that the cascaded current source 120 provides a tail current for the standard NMOS differential pair 205 and the natural NMOS differential pair 220. In some embodiments, drain terminals of the NMOS 270 and the NMOS 275 are coupled as discussed above, a gate terminal of each of the NMOS 270 and the NMOS 275 is coupled to an output of the constant current source 245, and source terminals of the NMOS 270 and the NMOS 275 are coupled to a drain terminal of the NMOS 280. In some embodiments, a gate terminal of the NMOS 280 is coupled to a node 295, and a source terminal of the NMOS 280 is coupled to the ground voltage potential.

In some embodiments, the cascaded current source 120 may be viewed as two cascaded current sources that share a current output. For example, the NMOS 270 and the NMOS 280 may comprise a first cascaded current source and the NMOS 275 and the NMOS 280 may comprise a second cascaded current source. By implementing the differential input stage 100 using the standard NMOS differential pair 205 and the natural NMOS differential pair 220 and sharing the NMOS 280 between the NMOS 270 and the NMOS 275, the differential input stage 100 may consume less power and less surface area of an electronic circuit (e.g., semiconductor die, printed circuit board, etc.) than another differential input stage in which multiple tail currents are utilized and/or separate cascaded current sources that do not share a current output are utilized. In addition, the differential input stage 100 may be less expensive to manufacture and/or operate than another differential input stage in which multiple tail currents are utilized and/or separate cascaded current sources that do not share a current output are utilized.

In some embodiments, the cascaded current mirror source 130 is coupled between the constant current source 245 and the ground voltage potential. In some embodiments, a drain terminal of the NMOS 255 is coupled to the output of the constant current source 245, a gate terminal of the NMOS 255 is coupled to the output of the constant current source 245, and a source terminal of the NMOS 255 is coupled to the node 295. In some embodiments, a drain terminal of the NMOS 260 is coupled to the node 295, a gate terminal of the NMOS 260 is coupled to the node 295, and a source terminal of the NMOS 260 is coupled to the ground voltage potential.

The cascaded current mirror source 130 provides one or more reference voltages to the current source 120. The reference voltages may be used by the current source 120 as bias voltages for controlling the NMOS 270. NMOS 275, and/or NMOS 280 (e.g., controlling an amount of current flowing through on or more of the NMOS 270, NMOS 275, and/or NMOS 280). In some embodiments, a value of the tail current of the current source 120 is determined at least partially according to the reference voltages provided to the current source 120 by the cascaded current mirror source 130. In some embodiments, the current source 120 provides tail currents for each of the standard NMOS differential pair 205 and the natural NMOS differential pair 220. For example, NMOS 270 and 280 together provide a tail current for the natural NMOS differential pair 220 based at least partially on the reference voltages and NMOS 275 and 280 together provide a tail current for the standard NMOS differential pair 205 based at least partially on the reference voltages. The cascaded current mirror source 130 is configured based at least partially on the cascaded current source 120. For example, the NMOS 255 is selected to have a same transistor width as the NMOS 270, or to have a transistor width that is scaled based on a transistor width of the NMOS 270 such that an approximately same density of current flows through the NMOS 255 and the NMOS 270. For example, a scaling factor of the transistor width of the NMOS 255 with respect to a transistor width of the NMOS 270 may be determined at least partially according to the current provided by the constant current source 245 and a tail current of the cascaded current source 120 (e.g., such as a current flowing through the NMOS 280). In some embodiments, a transistor length of each of the NMOS 255. NMOS 270, and NMOS 275 may be substantially the same.

In some embodiments, the cascaded current mirror source 130 is omitted from the differential input stage 100. In such embodiments, the cascaded current mirror source 130 may be replaced, for example, by a low voltage cascade circuit (not shown) operable to provide one or more reference voltages to the current source 120 and at least partially upon which the tail currents of the current source 120 may be based. In other embodiments, the cascaded current mirror source 130 may be omitted and the current source 120 may receive one or more reference voltages from any one or more other components or electrical devices, either within or external to the differential input stage 100, that may provide the one or more reference voltages to the current source 120 and at least partially upon which the tail currents of the current source 120 may be based.

In some embodiments, the NMOS 270 and NMOS 275 may each have transistor widths selected such that, when both the standard NMOS differential pair 205 and the natural NMOS differential pair 220 are conducting current, a majority of the current flowing through the differential input stage 100 flows through the standard NMOS differential pair 205 and the NMOS 275. For example, the transistor width of the NMOS 275 may have an about twenty to one ratio to the transistor width of the NMOS 270 in some embodiments of the differential input stage 100. In such embodiments (e.g., when the twenty to one ratio exists), the NMOS 275 conducts approximately twenty times as much current as the NMOS 270 when both the standard NMOS differential pair 205 and the natural NMOS differential pair 220 are conducting current. In some embodiments, the ratio of the transistor width of the NMOS 275 to the transistor width of the NMOS 270 may be determined according to desired operational characteristics of the differential input stage 100.

At high input signal voltages, the NMOS 225 and NMOS 230 of the natural NMOS differential pair 220 may each lose their gain characteristics and instead function substantially as resistors (e.g., as a result of a low drain to source voltage difference of the NMOS 225 and the NMOS 230). As such, at high input signal voltages the NMOS 225 and the NMOS 230 may create resistive loading on an output of the differential input stage 100. To prevent this resistive loading, the diodes 235 and 240 may isolate the resistance of the NMOS 225 and NMOS 230 at high input signal voltages from an output of the differential input stage 100. For example, the diode 235 may be coupled between the first output of the differential input stage 100 and a drain terminal of the NMOS 225 and the diode 240 may be coupled between the second output of the differential input stage 100 and a drain terminal of the NMOS 230. The diodes 235 and 240 are oriented in such a manner as to allow current to flow through the NMOS 225 and NMOS 230 (e.g., from the drain terminal to a source terminal of each respective NMOS 225 or NMOS 230) while isolating electrical characteristics (e.g., such as resistance) or a reverse flow of current of the NMOS 225 and NMOS 230 from the outputs of the differential input stage 100.

As discussed above, based on a voltage level of an input signal received by the differential input stage 100, one, or both, of the standard NMOS differential pair 205 and the natural NMOS differential pair 220 may be active and conducting current. This functionality enables the differential input stage to function rail-to-rail. To demonstrate this functionality, four operational states of the differential input stage 100 will be discussed below. In the following discussion, it is assumed for each of the four operational states that all characteristics of the differential input stage 100 (e.g., source supply voltage, physical characteristics of components, output of constant current source 245, etc.) remain substantially consistent other than a voltage level of the input signal(s) and/or output signal(s).

In some embodiments, the differential input stage 100 receives an input signal (e.g., a differential input signal) with a common mode voltage having a high voltage level (e.g., such as a voltage level at or near a voltage level of a source supply coupled to the differential input stage 100). When driven by the input signal having the high voltage level, NMOS 225 and NMOS 230 operate substantially linearly (e.g., in a linear region of the NMOS electrical characteristics of the NMOS 225 and the NMOS 230). This linearity results in NMOS 225 and NMOS 230 no longer imparting a gain on the input signal and instead function substantially as resistors in the differential input stage 100. The diodes 235 and 240 are oriented such that, from a perspective of the NMOS 225 and the NMOS 230, the diodes 235 and 240 are blocking diodes. As such, the diodes 235 and 240 prevent the NMOS 225 and NMOS 230 from creating a loading effect on a remainder of the differential input stage 100 and/or other components which may be coupled to the differential input stage by, for example, isolating the resistance of the NMOS 225 and NMOS 230 from the nodes 285 and 290, respectively while still passing through a minimal amount of current (e.g., such as an offset current).

In such embodiments, only the standard NMOS differential pair 205 provides a gain in the differential input stage 100. Because the NMOS 275 is larger than the NMOS 270 and configured to conduct a majority of current passing through the differential input stage 100, an overall gain provided by the differential input stage 100 remains approximately unchanged despite the natural NMOS differential pair 220 functioning as resistors and providing no gain.

In other embodiments, the differential input stage 100 may receive an input signal having a voltage level that is neither high nor low, but which may be closer to the voltage of the source supply than to the ground voltage potential (e.g., the voltage level of the input voltage signal may be greater than one half of the source supply voltage level). In such embodiments, both the standard NMOS differential pair 205 and the natural NMOS differential pair 220 may be active and may conduct current. Similarly, in such embodiments, both the standard NMOS differential pair 205 and the natural NMOS differential pair 220 may provide a gain in the differential input stage 100. However, the transistor width difference between the NMOS 270 and the NMOS 275 (e.g., where the NMOS 275 has a larger transistor width than the NMOS 270, as discussed above, and therefore conducts a greater amount of current than the NMOS 270) may cause the standard NMOS differential pair 205 to provide a majority of the gain in the differential input stage 100. For example, because of the transistor width difference in the NMOS 270 and the NMOS 275, a majority of the tail current of the differential input stage 100 will flow through the NMOS 275 to the NMOS 280 and correspondingly through the standard NMOS differential pair 205. A ratio of the tail current that flows through the NMOS 275 compared to the tail current that flows through the NMOS 270 may be approximately the same as a ratio of the transistor width of the NMOS 275 to the transistor width of the NMOS 270. For example, for an embodiment of the differential input stage 100 including an NMOS 275 having a transistor width of 20 and an NMOS 270 having a transistor width of 1, approximately 20 times as much of the tail current will flow through the NMOS 275 as flows through the NMOS 270.

In yet other embodiments, the differential input stage 100 may receive an input signal having a voltage level that is neither high nor low, but may be closer to the ground voltage potential than to the voltage of the source supply (e.g., the voltage level of the input voltage signal may be less than one half of the source supply voltage level). In such embodiments, both the standard NMOS differential pair 205 and the natural NMOS differential pair 220 may be active and may conduct current. Similarly, both the standard NMOS differential pair 205 and the natural NMOS differential pair 220 may provide a gain in the differential input stage 100.

In such embodiments, the NMOS 270 may hold the source terminal of the NMOS 275 at a voltage level based on the NMOS 270 (e.g., a gate to source voltage of the NMOS 270). This voltage level, while sufficient to cause the NMOS 275 to conduct current, may be insufficient to cause the NMOS 275 to operate in a saturation region in which a greater amount of current may flow through the NMOS 275. To compensate for the reduced current flow through the NMOS 275, which mitigates the transistor width difference between the NMOS 270 and the NMOS 275, the NMOS 270 conducts an increased amount of current. For example, the NMOS 270 and the NMOS 275 may conduct a similar amount (e.g., an approximately equal amount) of the tail current of the differential input stage 100. Both the standard NMOS differential pair 205 and the natural NMOS differential pair 220 may provide the gain in the differential input stage 100 in approximately equal proportions.

In yet other embodiments, the differential input stage 100 may receive an input signal having a low voltage level (e.g., such as a voltage level at or near the ground voltage potential that is less than the activation threshold of the NMOS 210 and NMOS 215). When driven by the input signal having the low voltage level, NMOS 210 and NMOS 215 conduct substantially no current from their respective drain terminals to theft respective source terminals. For example, because the input signal has a low voltage level that is less than the activation threshold of the NMOS 210 and NMOS 215, the NMOS 210 and NMOS 215 are turned "off." Conversely, when driven by the input signal having a low voltage level, NMOS 225 and NMOS 230 conduct current from their respective drain terminals to their respective source terminals. Because the NMOS 210 and the NMOS 215 are turned off, only the natural NMOS differential pair 220 provides a gain in the differential input stage 100 and conducts substantially all current passing through the differential input stage 100. An overall gain provided by the differential input stage 100 remains approximately unchanged despite the standard NMOS differential pair 205 being turned off and only the natural NMOS differential pair 220 providing the gain.

In some embodiments, the differential input stage 100 according to the foregoing description provides a gain for an input signal having a voltage level ranging from low to high using a single tail current, a pair of standard NMOS transistors, and a pair of natural NMOS transistors without requiring the use of PMOS transistors and/or multiple tail currents. In this way, the differential input stage 100 provides a gain for a wide range of input signals by transitioning between the pair of standard NMOS transistors and the pair of natural NMOS transistors based at least partially on the voltage level of the input signal. The differential input stage 100 switches between the standard NMOS differential pair 205 and the natural NMOS differential pair 220, at least in some embodiments, without requiring separate control circuitry to control which of the standard NMOS differential pair 205 or the natural NMOS differential pair 220 are active and providing a gain in the differential input stage 100. Through the use of the standard NMOS differential pair 205 and the natural NMOS differential pair 220 in place of using one or more PMOS transistors, circuit complexity of the differential input stage 100 may be reduced, size (e.g., footprint or surface area consumed) of the differential input stage 100 may be reduced (e.g., because NMOS transistors have a smaller size than PMOS transistors and/or share a single tail current), and cost may be reduced (e.g., manufacturing and/or operating costs of the differential input stage 100), thereby improving the differential input stage 100 over other devices.

Figure 3:
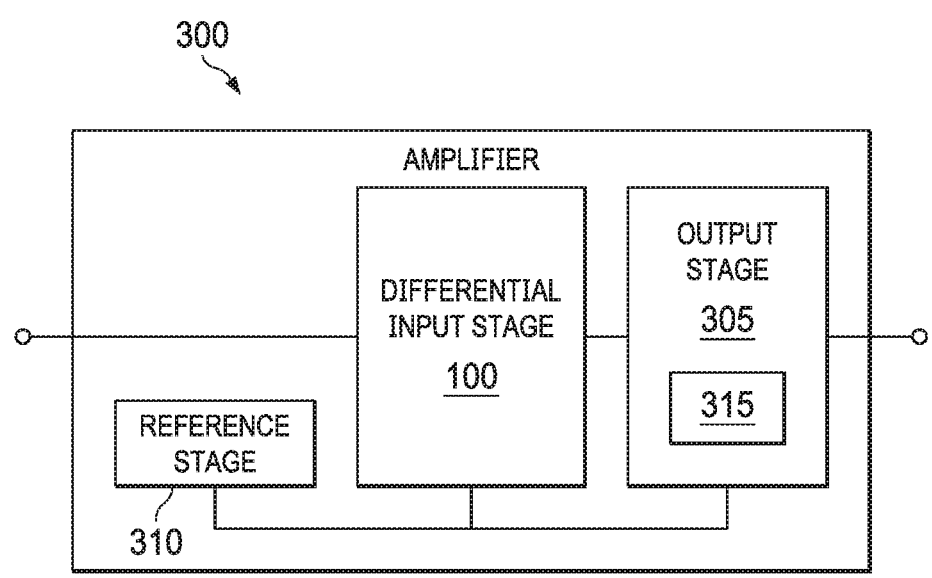
FIG. 3 shows a schematic diagram of an illustrative amplifier in accordance with various embodiments.

Referring now to FIG. 3, a schematic diagram of an illustrative amplifier 300 in accordance with various embodiments is shown. The amplifier 300 may, for example, provide amplification of a received input signal to generate an output signal and/or buffer the input signal to provide as the output signal. Although illustrated in FIG. 3 for the sake of simplicity as receiving input via a single communication line and providing an output via a single output line, the amplifier 300 may receive any number of inputs (e.g., two inputs to form a differential input) and provide any number of outputs. The amplifier 300 may be, for example and without limitation, an operational amplifier and/or an operational transconductance amplifier. The amplifier 300 may be implemented as a standalone device (e.g., implemented on its own die, enclosed within its own chip package, etc.) or may be implemented with other devices (e.g., on a die including other devices, enclosed in a chip package that includes other devices, etc.).

In some embodiments, the amplifier 300 comprises the differential input stage 100, discussed above with respect to FIG. 1 and FIG. 2, and an output stage 305. In some embodiments, the amplifier 300 may further comprise a plurality of output stages 305. In some embodiments, the amplifier 300 further comprises a reference stage 310. The differential input stage 100 receives an input signal and provides an output to the output stage 305. While illustrated as receiving one input, the differential input stage 100 may receive any number of inputs, the scope of which is not limited herein. The output of the differential input stage 100 is, in some embodiments, an amplification of a difference between a first input received by the differential input stage and a second input received by the differential input stage (e.g., between first and second portions of the received input signal, such as positive and negative components of a differential signal or between an input signal and a feedback signal). The output stage 305 is configured to receive and further amplify (or alternatively, buffer) the output of the differential input stage 100 for providing as an output of the amplifier 300. While illustrated as providing one output, the output stage 305 may provide any number of outputs, the scope of which is not limited herein. The output stage 305 may comprise, for example, one or more transistors 315 configured to further amplify (or buffer) the output of the differential input stage 100. Particular components included in the output stage 305, or a particular structure of the output stage 305, are not limited herein and the present disclosure is intended to encompass any amplifier output stage coupled to a differential input stage 100 as disclosed herein.

The reference stage 310, in some embodiments, comprises one or more components (e.g., resistors, capacitor, transistors, etc.) that may be configured to provide a reference signal (e.g., reference current or reference voltage) for use by either, or both, of the differential input stage 100 and/or the output stage 305. Particular components included in the reference stage 310, or a particular structure of the reference stage 310, are not limited herein and the present disclosure is intended to encompass any amplifier reference stage coupled to a differential input stage 100 as disclosed herein.

In the foregoing discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A differential input stage comprising:
a first n-type metal oxide semiconductor transistor (NMOS) pair coupled to a first input and a second input, the first NMOS pair having one activation threshold;
a second NMOS pair coupled to the first input, a first output node, the second input, and a second output node, the second NMOS pair having another activation threshold different than the one activation threshold;
a first diode coupled between one transistor of the first NMOS pair and the first output node;
a second diode coupled between the other transistor of the first NMOS pair and the second output node; and
a cascaded current source coupled to the first NMOS pair and the second NMOS pair.

2. The differential input stage of claim 1, in which the first NMOS pair includes a first NMOS transistor and a second NMOS transistor configured as a first differential amplifier, the second NMOS pair includes a third NMOS transistor and a fourth NMOS transistor configured as a second differential amplifier, the first NMOS transistor is coupled to the first input, the second NMOS transistor is coupled to the second input, the third NMOS is coupled to the first input and the first output node, and the fourth NMOS is coupled to the second input and the second output node.

3. The differential input stage of claim 1 in which the cascaded current source includes a fifth NMOS transistor coupled to the first NMOS pair, a sixth NMOS transistor coupled to the second NMOS pair, and a seventh NMOS transistor coupled between the fifth NMOS transistor, the sixth NMOS transistor, and a ground.

4. The differential input stage of claim 3 in which the seventh NMOS transistor is configured to sink a tail current of the first NMOS pair and the second NMOS pair to the ground.

5. The differential input stage of claim 3 in which a transistor width of the sixth NMOS transistor is larger than a transistor width of the fifth NMOS transistor.

6. The differential input stage of claim 5 including a constant current source and a second cascaded current source, the second cascaded current source is coupled between the constant current source and the ground voltage potential, and the second cascaded current source is further coupled to the cascaded current source and is configured to provide a reference value to the cascaded current source to at least partially control the cascaded current source.

7. The differential input stage of claim 6 in which the second cascaded current source includes an eighth NMOS transistor and a ninth NMOS transistor, the eighth NMOS transistor is coupled between the constant current source and the ninth NMOS transistor, and the ninth NMOS transistor is coupled between the eighth NMOS transistor and the ground voltage potential.

8. The differential input stage of claim 7 in which a transistor width of the eighth NMOS transistor is based on the transistor width of the fifth NMOS transistor to configure the eighth NMOS transistor and the fifth NMOS transistor.

9. The differential input stage of claim 1 in which the differential input stage is configured to output a signal based on a received input signal, the output signal has a gain determined by the differential input stage, the first NMOS pair contributes a majority of the gain at low input voltage levels, and the second NMOS pair contributes the majority of the gain at high input voltage levels.

10. The differential input stage of claim 1 in which the one activation threshold is zero volts and the another activation threshold is one volt.

11. An amplifier comprising:
a differential input stage including:
a first n-type metal oxide semiconductor transistor (NMOS) pair coupled to a first input and a second input, the first NMOS pair having one activation threshold;
a second NMOS pair coupled to the first input, the second input, a first output node, and a second output node, the second NMOS pair having another activation threshold different than the one activation threshold;
a first diode coupled between the first NMOS pair and the first output node;
a second diode coupled between the first NMOS pair and the second output node; and
a cascaded current source coupled between the first NMOS pair, the second NMOS pair, and a ground; and
an output stage coupled to the first output node and the second output node and including at least one transistor configured to amplify an output of the differential input stage present at the first and second output nodes to produce an amplifier output.

12. The amplifier of claim 11, in which the cascaded current source includes a first NMOS transistor coupled to the first NMOS pair, a second NMOS transistor coupled to the second NMOS pair, and a third NMOS transistor coupled between the first NMOS transistor, the second NMOS transistor, and the ground voltage potential.

13. The amplifier of claim 12 in which the first NMOS pair includes:
a fourth NMOS transistor coupled between the first diode and the first NMOS transistor and to the first input; and
a fifth NMOS transistor coupled between the second diode and the first NMOS transistor and to the second input, and
the second NMOS pair includes:
a sixth NMOS transistor coupled between the first output node and the second NMOS transistor and to the first input; and
a seventh NMOS transistor coupled between the second output node and the second NMOS transistor and to the second input.

14. The amplifier of claim 12 in which the second NMOS transistor has a larger transistor width than the first NMOS transistor.

15. The amplifier of claim 11 in which the differential input stage includes a constant current source and a second cascaded current source including an eighth NMOS transistor and a ninth NMOS transistor.

16. The amplifier of claim 15 in which the constant current source is coupled between a source voltage and the eighth NMOS transistor, and the ninth NMOS transistor is coupled between the eighth NMOS transistor and the ground voltage potential.

17. The amplifier of claim 16 in which the second cascaded current source is coupled to the cascaded current source and configured to provide a reference value to the cascaded current source to at least partially control the cascaded current source.

18. A differential input stage comprising:
a first diode having a first anode coupled to a first output node;
a second diode having a second anode coupled to a second output node;
a first n-type metal oxide semiconductor (NMOS) differential amplifier including:
a first NMOS transistor including:
a first gate terminal coupled to a first input;
a first drain terminal coupled to a cathode of the first diode; and
a first source terminal coupled to a first node; and
a second NMOS transistor including:
a second gate terminal coupled to a second input;
a second drain terminal coupled to a cathode of the second diode; and
a second source terminal coupled to the first node;
a second NMOS differential amplifier comprising including:
a third NMOS transistor including:
a third gate terminal coupled to the first input;
a third drain terminal coupled to the first output node; and a third source terminal coupled to a second node; and a fourth NMOS transistor including:
 a fourth gate terminal coupled to the second input;
 a fourth drain terminal coupled to the second output node; and
 a fourth source terminal coupled to the second node; and a cascaded current source coupled between the first node, the second node, and a ground.

19. The differential input stage of claim 18, wherein the cascaded current source includes:
 a fifth NMOS transistor including:
  a fifth gate terminal coupled to a third node;
  a fifth drain terminal coupled to the first node; and
  a fifth source terminal coupled to a fourth node;
 a sixth NMOS transistor including:
  a sixth gate terminal coupled to the third node;
  a sixth drain terminal coupled to the second node; and
  a sixth source terminal coupled to the fourth node; and
 a seventh NMOS transistor including:
  a seventh gate terminal coupled to a fifth node;
  a seventh drain terminal coupled to the fourth node; and
  a seventh source terminal coupled to the ground voltage potential.

20. The differential input stage of claim 19, including:
 a constant current source coupled between a voltage source and the third node; and
 a second cascaded current source including:
  an eighth NMOS transistor comprising:
   an eighth gate terminal coupled to the third node;
   an eighth drain terminal coupled to the third node; and
   an eighth source terminal coupled to the fifth node; and
  a ninth NMOS transistor including:
   a ninth gate terminal coupled to the fifth node;
   a ninth drain terminal coupled to the fifth node; and
   a ninth source terminal coupled to the ground voltage potential.

* * * * *